United States Patent
Schratz et al.

(10) Patent No.: US 9,696,366 B2
(45) Date of Patent: *Jul. 4, 2017

(54) TERMINAL TESTING DEVICE AND ADAPTERS

(71) Applicants: Gary F. Schratz, Yelleville, AR (US); Donald J. McBride, Everton, AR (US)

(72) Inventors: Gary F. Schratz, Yelleville, AR (US); Donald J. McBride, Everton, AR (US)

(73) Assignee: SemahTronix, LLC, Flippin, AR (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/789,011

(22) Filed: Jul. 1, 2015

(65) Prior Publication Data
US 2015/0301099 A1 Oct. 22, 2015

Related U.S. Application Data

(63) Continuation of application No. 13/654,993, filed on Oct. 18, 2012, now Pat. No. 9,105,993.

(51) Int. Cl.
*G01R 31/04* (2006.01)
*G01R 1/04* (2006.01)
*H01R 13/08* (2006.01)

(52) U.S. Cl.
CPC ......... *G01R 31/045* (2013.01); *G01R 1/0408* (2013.01); *G01R 31/04* (2013.01); *H01R 13/08* (2013.01)

(58) Field of Classification Search
CPC ....... H01R 13/08; G01R 1/0408; G01R 31/04
See application file for complete search history.

(56) References Cited

U.S. PATENT DOCUMENTS

| | | | | |
|---|---|---|---|---|
| 3,292,430 A * | 12/1966 | Collier et al. | ............. | 73/862.01 |
| 3,877,997 A * | 4/1975 | Brown | .......................... | 438/139 |
| 3,879,997 A | 4/1975 | Mann | | |
| 6,116,935 A * | 9/2000 | Fukuda | .......................... | 324/538 |
| 7,030,636 B1 * | 4/2006 | Bergan et al. | ............. | 324/756.04 |
| 7,985,079 B1 * | 7/2011 | Wilson et al. | ................... | 439/74 |
| 8,147,278 B2 * | 4/2012 | Renteria et al. | .............. | 439/676 |
| 8,201,322 B2 * | 6/2012 | Schratz | .................... | G02B 6/25 226/162 |
| 9,105,993 B2 * | 8/2015 | Schratz | ................... | H01R 13/08 |
| 2010/0301503 A1 * | 12/2010 | Schratz | .................... | G02B 6/25 264/1.26 |
| 2011/0008995 A1 * | 1/2011 | Beaulieu | ........................ | 439/482 |
| 2014/0087569 A1 | 3/2014 | Lee | | |
| 2014/0111236 A1 * | 4/2014 | Schratz et al. | ........... | 324/750.25 |

* cited by examiner

*Primary Examiner* — Jermele M Hollington
(74) *Attorney, Agent, or Firm* — Carter Ledyard & Milburn LLP

(57) ABSTRACT

A terminal testing device provides an adapter customized to a port of a connector being tested so that force applied to the adapter identifies loose and fixed terminals in the connector. The adapter includes springs and push pins that correspond in number to the number of terminals being tested and has a face plate that corresponds to the type of connector being tested. The push pins provide force against the terminal end. Specifically, the device seats the adapter and connector to align both and permit force to be in line with terminal ends. The force applied to the terminal ends is uniform and controlled by means of the adapter and is obtained by a single driving means.

17 Claims, 7 Drawing Sheets

TERMINAL TESTING DEVICE AND ADAPTERS

PRIORITY AND RELATED APPLICATION

This application is a continuation of application Ser. No. 13/654,993, filed on Oct. 18, 2012, now U.S. Pat. No. 9,105,993, which is hereby incorporated by reference in its entirety.

FIELD OF THE INVENTION

The present invention relates to terminal testing devices. Specifically, the present invention relates to testing for unseated terminals in connector housings.

BACKGROUND OF THE INVENTION

There are a number of devices and way to test terminal ends in connectors. A traditional testing method is to manually test the terminal by hand. Here a tool is pressed against each terminal by hand. The chances of error here is high as the person applying pressure cannot control the amount of pressure applied each time. Thus loose or defectively latched terminals may not be identified or correctly positioned terminals may be dislodged. Also the direction of force may not always be in line with the terminal end so the terminal has a chance of bending during testing. Another problem with manual testing is that only one terminal end is tested at a time making the testing process very time consuming. Though devices have been created to address the manual problems listed above, these devices come with other problems. For instance, devices may only test a few terminals at a time or are only designed to test one specific type of connector. A device is therefore desired that can tests multiple terminals in an entire connector at once. A device is further desired that can test multiple rows of terminals at the same time. Such a desired device should have only one piston to apply calibrated force to test all terminals.

BRIEF SUMMARY OF THE INVENTION

A terminal testing device provides a driving means, a terminal testing adapter and a connector seat to seat a connector. The driving means provides forward pressure on the adapter, which then places pressure on terminal ends via adapter push pins. The device aligns the driving means, adapter and seated connector so the forced applied to the terminal ends is in line with the terminal ends and therefore prevent terminal end bending. The adapter includes a housing, channels, springs or biases, and push pins. On the front end of the housing there is a pressure plate and a face plate that conforms to the shape and terminal number of the connector being tested. The number of push pins correspond to the number of terminal ends being tested. Loose or defectively latched terminal ends are identified when such terminal ends exit the back of the connector housing due to the calibrated force applied thereon.

DETAILED DESCRIPTION OF THE INVENTION

Figure 1:
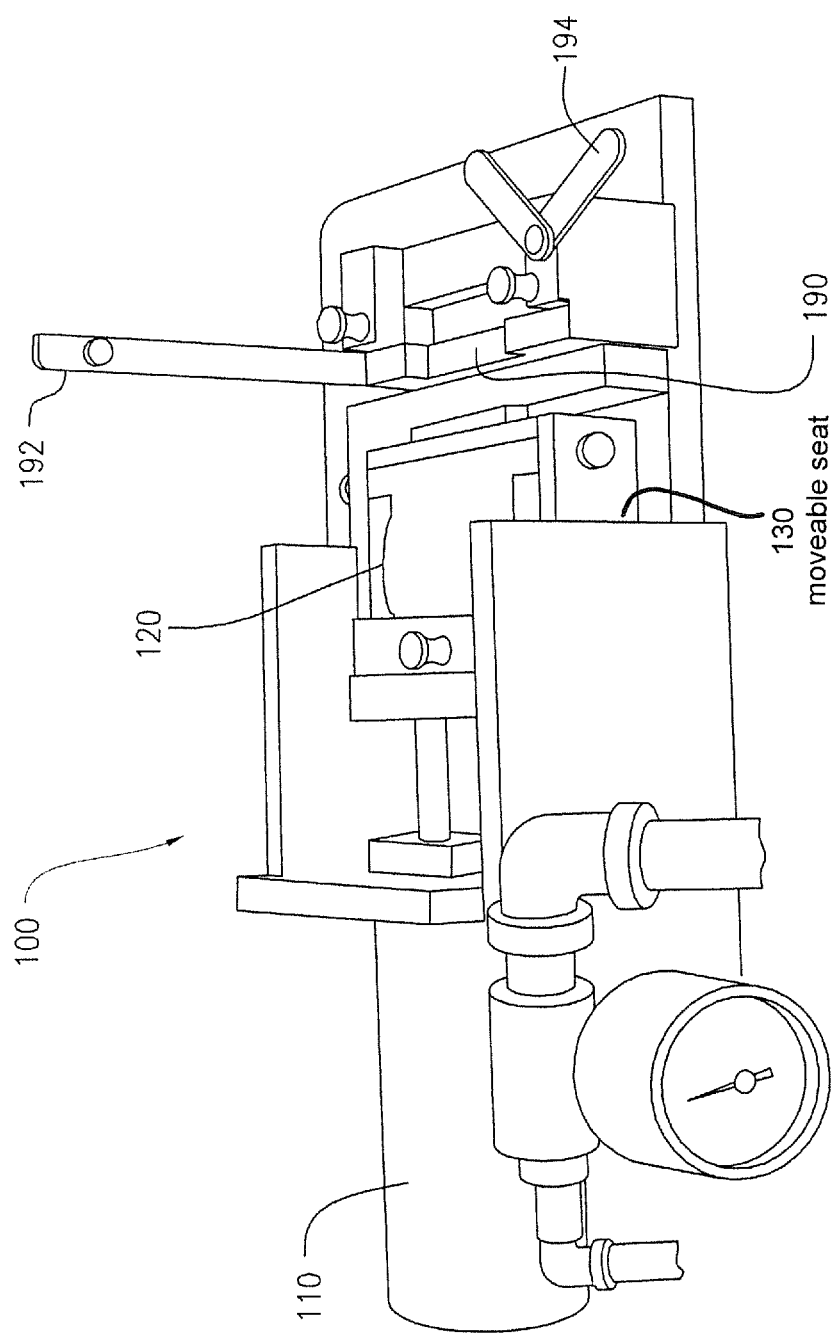
FIG. 1 is a terminal testing device of the present invention in an open configuration without a connector.

FIG. 1 shows a terminal testing device 100 of the present invention. The device 100 is designed to retain an adapter 120, 140 and align it with a connector 220, 240. The adapter 120, 140 is disposed in the middle of the device 100 between a connector holding nest 190 and a driving means 110 in moveable seat 130, 230.

The driving means 110 provides a consistent and controlled forward pressure to gradually push the adapter 120, 140 forward. The driving means 110 should provide calibrated force to each terminal end being tested to force out of position any terminal end 230, 260 that is not securely seated in a connector 220, 240. The calibrated force is a force that is predetermined, calculated or measured. For instance, the springs may be custom wound, cut to a length that produces a desired spring force for the amount of compression the springs will be compressed within the channels. The force applied by the driving means 110 will be in line with the connector 220 being tested and thus will avoid bending or otherwise damaging the terminal ends 230, 260 being tested. The driving means 110 may be only a single apparatus as the driving means applies force to all terminals at once.

Figure 2:
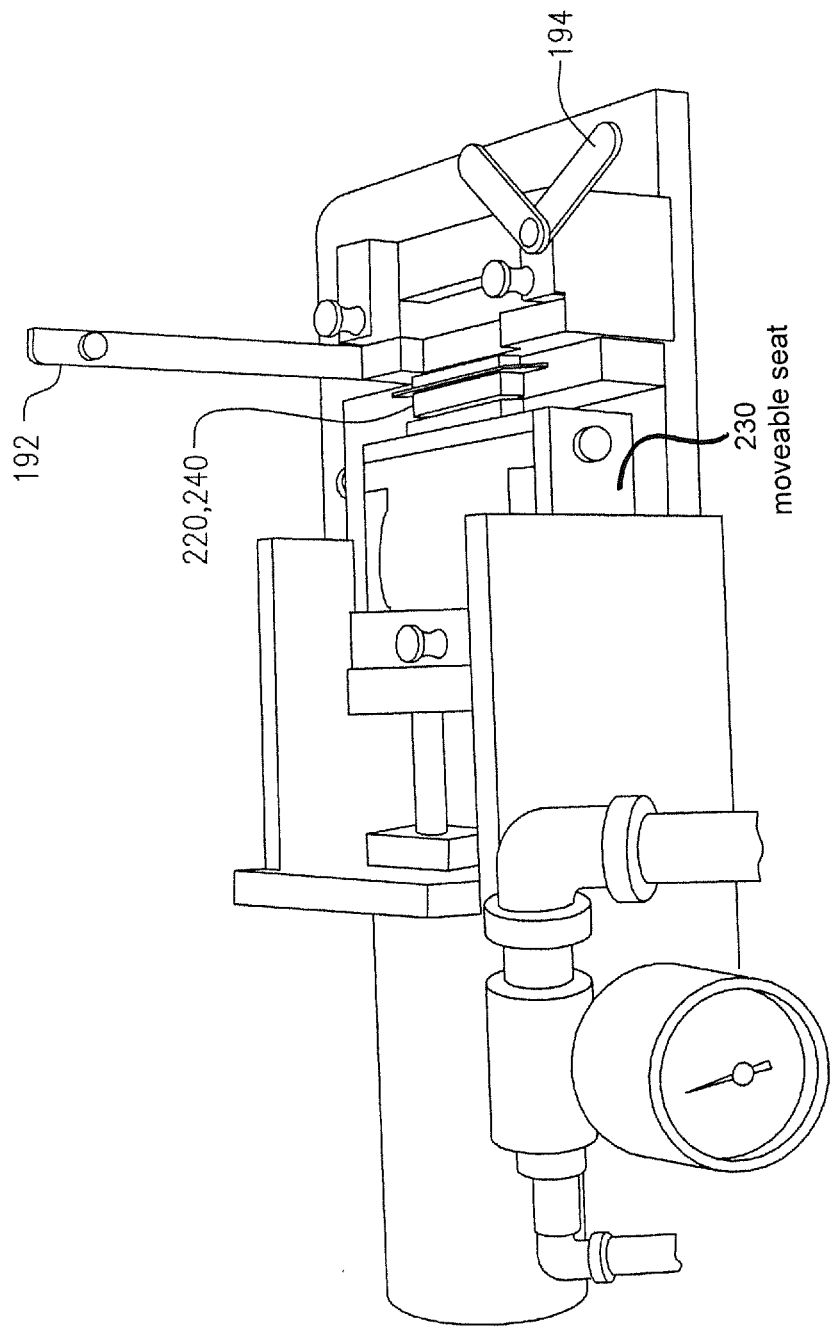
FIG. 2 is a terminal testing device of FIG. 1 with the connector seated.

The driving means 110 does not require manual strength as it includes but is not limited to actuating forces such as pneumatics, hydraulics, motor force, and the like. If a solenoid were used as the driving means 110, some non-limiting examples include a pancake solenoid and a cylinder solenoid such as those manufactured by Bimba Manufacturing Company of Monee, Ill. In one embodiment, the driving means 110 is a single device, such as a pneumatic device, that applies pressure to all pressure pins simultaneously. The connector holding nest 190 is on the other side of the adapter 120, 140. The nest 190 secures a connector 220, 240 using cooperating lever 192 and locking lever 194 as shown in FIG. 2.

The device 100 can be activated after the connector 220, 240 and the appropriate adapter 120, 140 are in place. The driving means 110 then pushes the adapter 120, 140 forward until the adapter is fully seated on the connector 220, 240. The device 100 enables the testing of connectors without manual intervention to align the adapter 120, 140 and the connector 220, 240 and without manual effort to apply any amount of pressure in testing the connector 220, 240.

The device 100 is adaptable to any style connector or any style of terminal as the adapters 120, 140 are not limited to geometric shape or type of terminal end. The adapters 120, 140 employed with the device 100 correspond to the type of connector 220, 240 desired to be tested. The adapter may be a male-corresponding adapter 120 to mate with pin terminal ends (male) connectors 220 or female-corresponding adapter 140 to mate with socket terminal ends (female) connectors 240. To facilitate explanation of the invention and the adapters, 9-pin and socket D-subminiature connectors will be used in the examples below. Use of the 9-pin/socket connectors are for exemplary purposes only.

Figure 3A:
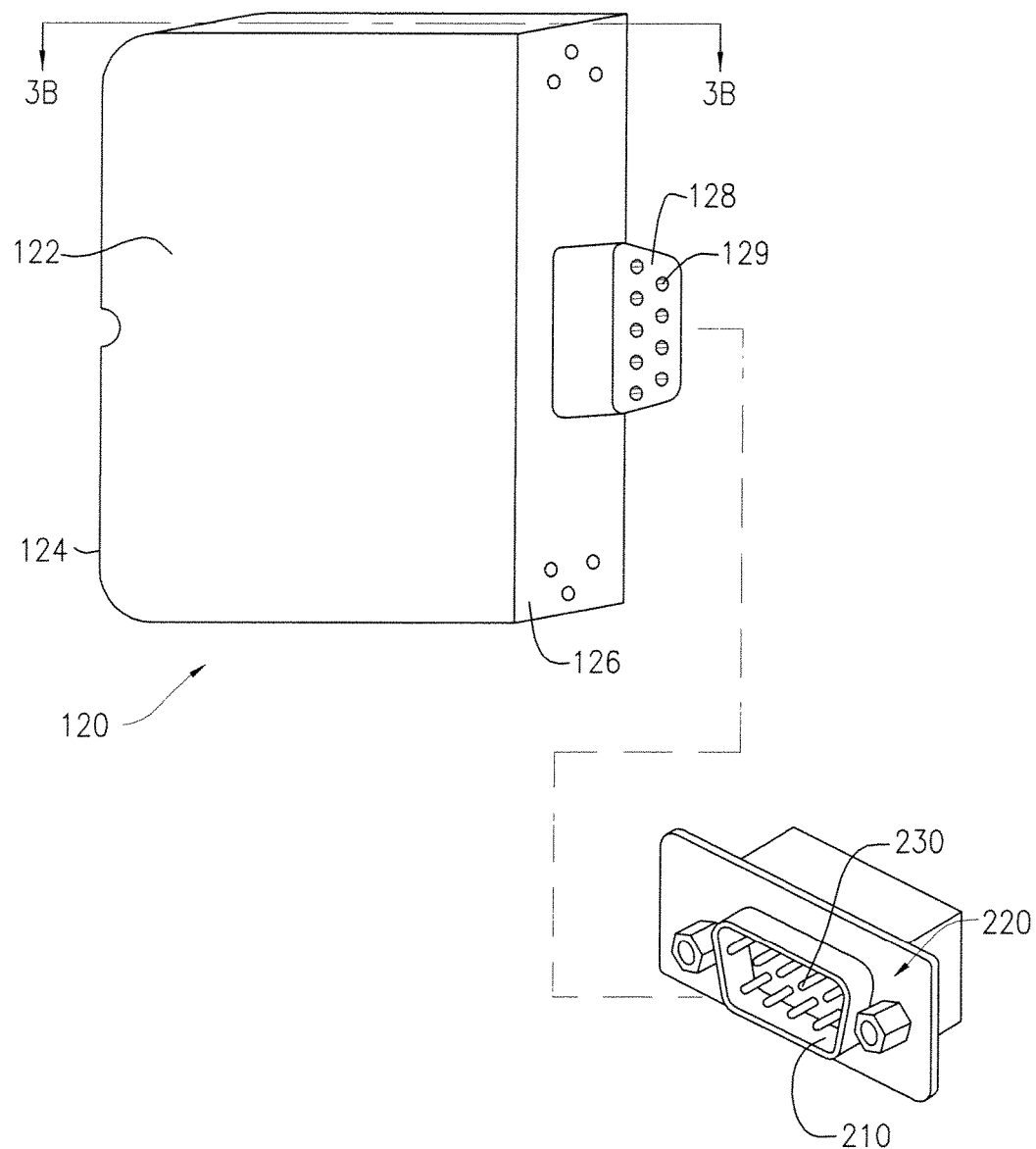
FIG. 3A is a view of a male adapter.

FIG. 3A shows a male-corresponding adapter 120 that tests a male connector 220 having pin terminal ends 230. The male adapter 120 includes a housing 122 having a rear end 124 and a front end defined by a pressure plate 126. The pressure plate 126 defines a male face 128 that corresponds to seat the port 210 of the male connector 220 and sockets 129 that accommodate the pin terminal ends 230 of the male connector 220.

Figure 4A:
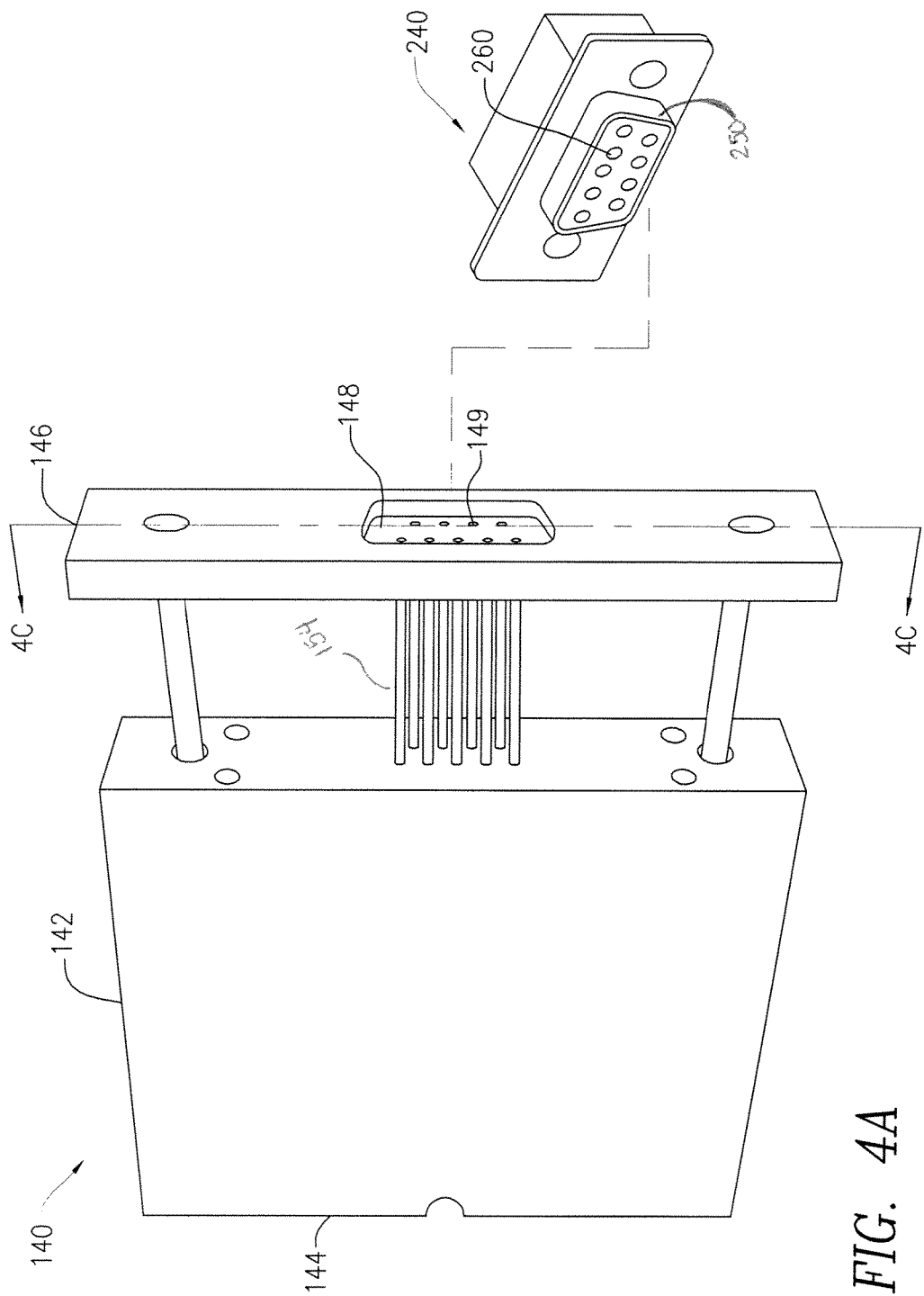
FIG. 4A is a view of a female adapter in a normal position.
Figure 4B:
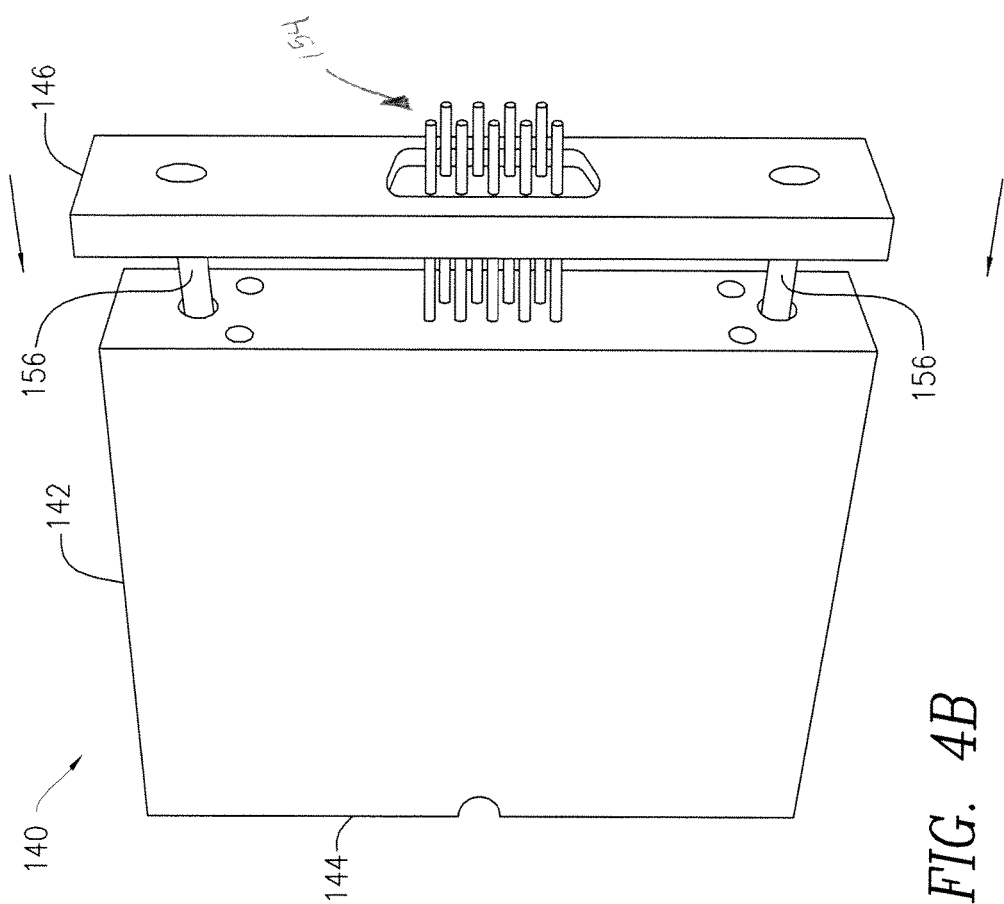
FIG. 4B is a view of FIG. 4A in a compressed position.

FIG. 4A shows a female-corresponding adapter 140 designed to test a female connector 240 having socket terminal ends 260. The female adapter 140 like the male adapter 120 has a housing 142 and a pressure plate 146 having a female face 148. The female face 148 is configured to seat the port 250 of the female connector 240 and ultimately have push pins 154 engage the socket terminal ends 260 of the female connector 240. The adapter's 140 pressure plate 146 is disposed at a front end of the housing 142 but, unlike the male adapter 120, is placed a distance from the housing 142 using loading pins 156. The loading pins 156 are spring loaded and thus are able to slide the pressure plate 146 to selectively expose first ends of push pins 154. See FIG. 4B.

Figure 3B:
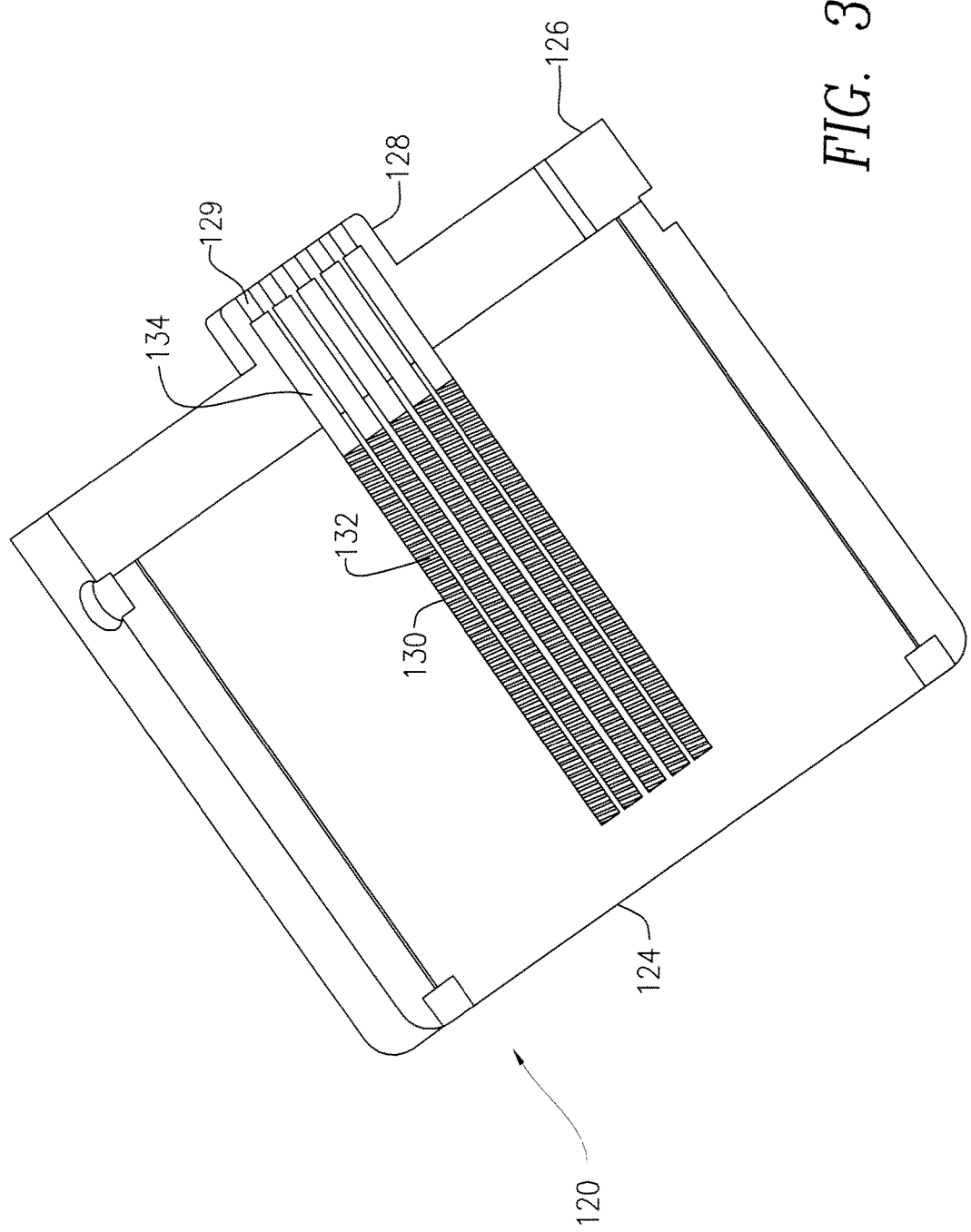
FIG. 3B is a view of FIG. 3A taken along line 3B-3B.
Figure 4C:
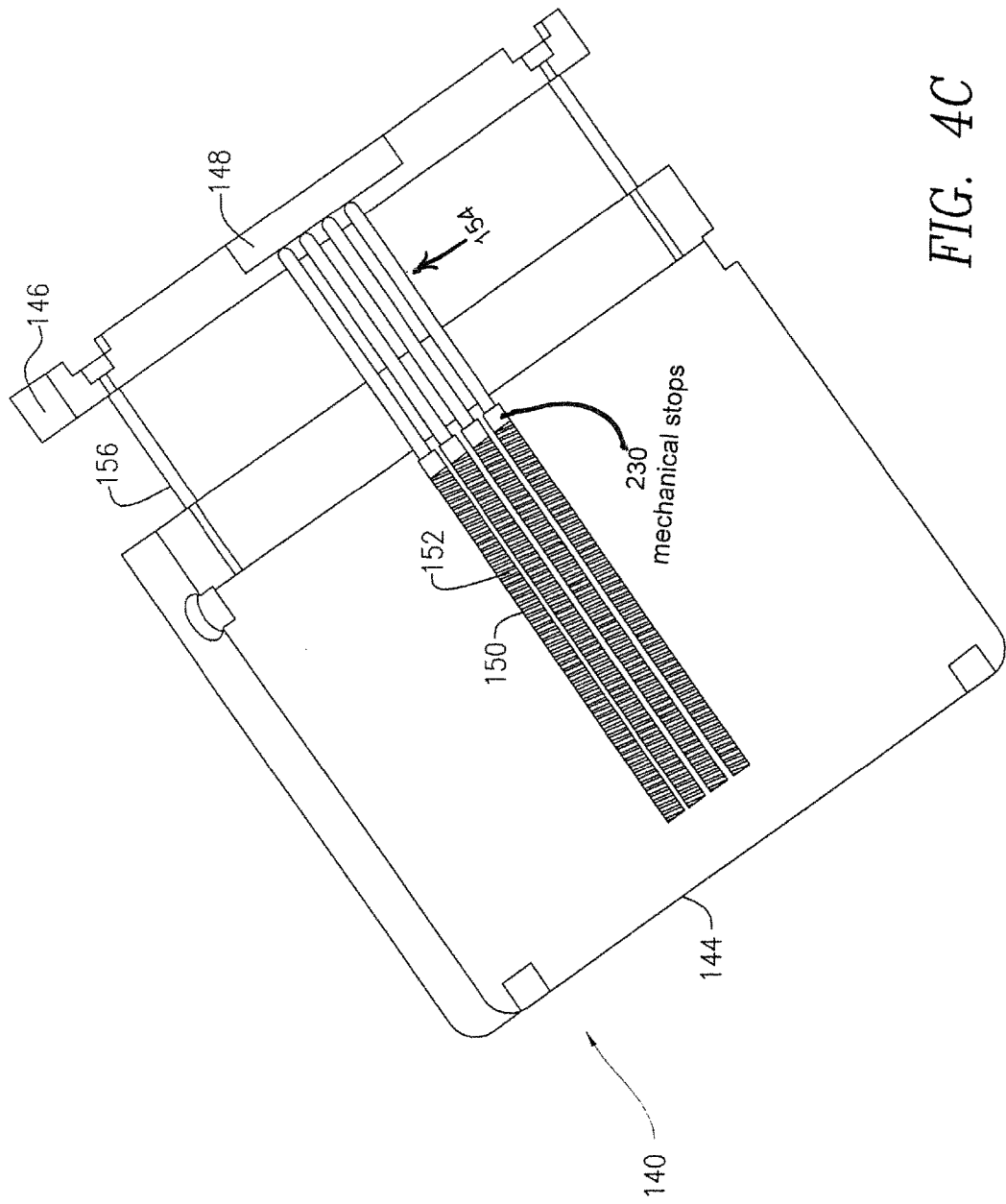
FIG. 4C is a view of FIG. 4A taken along line 4C-4C.

Looking now to FIGS. 3B and 4C, both adapters 120, 140 include a plurality of channels 130, 150 that occupies almost the full length of the housing 122, 142. In some embodiments, the channel runs from about the rear end 124, 144 to about the front end of the housing. A spring or bias 132, 152 is disposed in each channel 130, 150 along with a push pin 134, 154. Custom biases 132, 152 are used to provide a spring force based on spring size, material used and the distance the spring is compressed. Calculations can be made to determine the length, diameter and the travel length of the bias 132, 152 that is needed to produce a desired amount of push force on the terminal ends. In one instance, Hooke's law is used to calculate the dimensions of the bias needed. In one embodiment the bias 132, 152 may have a push force of 3-4 lbs., have a diameter of about 0.080 inches in diameter and have a spring travel of about ¼ inch. Mechanical stops 158 are employed to prevent the bias 132, 152 and thus the push pin 134, 154 from applying excessive force to the terminals being tested.

The bias 132, 152 is disposed entirely in the channel 130, 150 and runs the length of the channel 130, 150. The second end of the bias 132, 152 abuts the rear end 124, 144 of the housing 122, 142 and the first end of the bias 132, 152 abuts the second end of the push pin 134, 154. The second end of the push pin 134, 154 occupies the front end of the channel 130, 150 and the first end of the push pin 134, 154 extends into the face, 128, 148, respectively. In the female adapter 140 a portion of the push pins 154 are exposed outside the housing 142 before entering the female pressure plate 146 since the pressure plate 146 is disposed a distance from the housing 142. Also, the spring 152 in the female adapter 140 is longer than the spring 132 in the male adapter 120 to allow for the insertion of the push pin 154 into the socket 260 of the connector 240 being tested.

Regardless of the type of adapter 120, 140 used, each push pin 134, 154 is aligned with their respective bias 132, 152. Another feature common to both the male and female adapter 120, 140 is that the number of terminal ends (pins or sockets) in the connector 220, 240 being tested dictates the number of push pins 134, 154, channels 130, 150, and biases 132, 152 employed in the adapter 120, 140. Thus, the number of channels 130, 150 correspond to the number of terminal ends and, thus, each terminal in multiple rows of terminals or in complex arrangements of terminals will each have its own channel.

The adapters 120, 140 are designed to permit the first end of each push pin 134, 154 to test the pin terminal ends 230 or socket terminal ends 260 of the connectors 220, 240, respectively. Specifically, when the connector 220, 240 is seated on the face 128, 148 of a corresponding adapter 120, 140, the bias 132, 152 pushes the first end of the push pin 134, 154 against the terminal ends in the respective connectors 220, 240. With the female adapter 140, the push pins 154 are fed through the spring loaded pressure plate 146 prior to testing the sockets 260 in the connector 240. The push pins 154 need to slide into the socket terminal ends 260 of the connector 240 and bottom out inside the sockets 260 in order to apply force to the sockets 260.

Returning now to the device 100, the adapter 120, 140 engages and tests the connectors 220, 240 by way of the driving means 110. If the driving means 110 is an air cylinder piston, the piston pushes the adapter 120, 140 toward the connector 220, 240 being tested. In the male adapter 120 force is applied to the pin terminal ends 230 of the male connector 220 by the push pins 134 once the male connector 220 is seated on the male face 128 of the adapter 120. When using the female adapter 140 force is applied to the push pins 154 of the adapter 140 to extend into the sockets 260 of the female connector 240 after the female connector 240 is seated on female face 148. The pressure from the driving means on the adapter 140 pushes the pressure plate 146 back as the push pins 154 extend into and apply force to each socket terminal end 260 of the female connector 240.

If the terminal end is well-seated then that terminal end in the connector 220, 240 forces the push pins 134, 154 back inside the adapter 120, 140 causing the biases 132, 152 to compress. Loose terminal ends 230, 260 are easily noticed as the springing force of the bias 132, 152 builds with more compression and forces those loose terminal ends out through the back of the connector 220, 240 housing. This device 100 makes it easy to test for loose terminals by making it obvious to tell when terminal ends are not well-seated and thus needs to be fixed. Testing by this invention may be performed prior to molding so the terminal end can be re-inserted or otherwise repaired prior to molding. The device further enables quick testing of the terminal ends 230, 260 as all terminal ends 230, 260 in the connector are tested at the same time.

In addition to identifying loose terminal ends, the device 100 will push out a terminal 230, 260 that is correctly positioned but has a defective latch. Often the connector is completely filled with terminals to ensure that it is environmentally sealed but not all terminals are needed for electrical connections thus "dummy terminals" need to be inserted. These "dummy terminals" that are those terminals that don't have wires attached. These "dummy terminals" may be inserted into their properly latched positions by starting the terminals into their proper locations and then finishing them by pushing them into seated position in the connector using the present invention.

While the present invention has been described in conjunction with specific embodiments, those of normal skill in the art will appreciate the modifications and variations can be made without departing from the scope and the spirit of the present invention. Such modifications and variations are envisioned to be within the scope of the appended claims.

The invention claimed is:
1. A terminal testing device comprising:
   a driving means, the driving means providing forward pressure;
   a moveable seat for insertion of a custom terminal testing adapter, said moveable seat securing said adapter for movement within said device, and the custom terminal testing adapter, the adapter being driven forward by the driving means to apply a predetermined force on a terminal being tested, the adapter comprising:
a housing;
channels, said channels being disposed in the housing;
a bias disposed inside each said channel, said bias having a first end and a second end, said second end abutting a rear end of the housing, wherein said bias is customized to exert said predetermined force, said predetermined force being calibrated to force out of position any terminal end in a connector that is not securely seated;
a push pin disposed at the first end of the bias, said push pin being aligned with said bias, said push pin being aligned with said terminal;
a pressure plate, said pressure plate being disposed at a front end of the housing, said push pin being disposed by the pressure plate; and
a face plate, said face plate defined within a portion of the pressure plate, said face plate receiving said push pin, said face plate dimensioned to a port of said connector retaining said terminal,
wherein said moveable seat and said adapter move in concert when the device is activated.

2. The device of claim 1, wherein said face plate includes sockets corresponding to pin terminal ends of a male connector.

3. The device of claim 1, wherein said face plate includes pins corresponding to socket terminal ends of a female connector and wherein said pressure plate of said adapter is placed a distance from said housing, said pressure plate being connected to said housing using moveable loading pins.

4. The device of claim 1, wherein the bias is a spring.

5. The device of claim 1, wherein the push pin has a first end and a second end, said second end of the push pin being disposed at the first end of the bias.

6. The device of claim 1, wherein the channels correspond in number to a number of said terminal in said connector.

7. The device of claim 1, further comprising a connector nest, said connector nest aligning a port of said connector to the face plate of the adapter, wherein said push pin aligns with said terminal of the connector.

8. The device of claim 7, wherein force from said driving means places pressure on said terminal through said push pin, wherein a loose terminal is displaced from said connector by said force.

9. The device of claim 1, wherein said driving means is a single piston.

10. The device of claim 1, wherein said driving means is pneumatic.

11. A terminal testing device comprising:
a driving means, the driving means providing forward pressure;
a moveable seat for insertion of a custom terminal testing adapter, said moveable seat securing said adapter for movement within said device,
mechanical stops, said mechanical stops preventing said adapter from applying excessive force to a terminal being tested, and
the custom terminal testing adapter, the adapter being driven forward by the driving means to apply a predetermined force on a terminal being tested, the adapter comprising:
a housing;
channels, said channels being disposed in the housing;
a bias disposed inside each said channel, said bias having a first end and a second end, said second end abutting a rear end of the housing, wherein said bias is customized to exert said predetermined force, said predetermined force being calibrated to force out of position any terminal end in a connector that is not securely seated;
a push pin disposed at the first end of the bias, said push pin being aligned with said bias, said push pin being aligned with said terminal;
a pressure plate, said pressure plate being disposed at a front end of the housing, said push pin being disposed by the pressure plate; and
a face plate, said face plate defined within a portion of the pressure plate, said face plate receiving said push pin, said face plate dimensioned to a port of said connector retaining said terminal,
wherein said moveable seat and said adapter move in concert when the device is activated.

12. The device of claim 1, wherein said bias is customized based on the length of said bias.

13. The device of claim 1, wherein said bias is customized based on a material comprising said bias.

14. The device of claim 1, wherein said bias is customized based on the diameter of said bias.

15. The device of claim 1, wherein said bias is customized based on the travel length of said bias.

16. The device of claim 1, the adapter further comprising said push pin corresponding to a dummy terminal, said corresponding push pin directing a force on said dummy terminal causing a proper insertion of said dummy terminal into a connector.

17. The device of claim 3, wherein said loading pins are spring loaded.

* * * * *